United States Patent [19]
Kim et al.

[11] Patent Number: 5,851,728
[45] Date of Patent: Dec. 22, 1998

[54] THREE-COMPONENT CHEMICAL AMPLIFIED PHOTORESIST COMPOSITION

[75] Inventors: Seong-Ju Kim; Joo-Hyeon Park; Ki-Dae Kim; Dong-Chui Seo, all of Taejeon, Rep. of Korea

[73] Assignee: Korea Kumho Petrochemical Co., Ltd., Seoul, Rep. of Korea

[21] Appl. No.: 728,771

[22] Filed: Oct. 9, 1996

[30] Foreign Application Priority Data

Oct. 14, 1995 [KR] Rep. of Korea ................. 1995-35530

[51] Int. Cl.$^6$ ..................................... G03F 7/004
[52] U.S. Cl. .......................... 430/270.1; 430/905; 522/31
[58] Field of Search ................................ 430/270.1, 905; 522/31

[56] References Cited

U.S. PATENT DOCUMENTS 5,677,103  10/1997  Kim et al. ............................... 430/192

Primary Examiner—John S. Chu
Attorney, Agent, or Firm—Harrison & Egbert

[57] ABSTRACT

A three-component chemical amplified photoresist composition, comprising: an alkali soluble resin; a dissolution inhibitor of aromatic polyhydroxy compound substituted by at least two acid-decomposable radicals; and a photo acid generating agent of an onium salt, which is capable of forming good profiles when exposed to light with a short wavelength and is superior in heat resistance and storage stability.

3 Claims, No Drawings

THREE-COMPONENT CHEMICAL AMPLIFIED PHOTORESIST COMPOSITION

BACKGROUND OF THE INVENTION

1. Field of the Invention

The present invention relates to a three-component chemical amplified photoresist composition sensitive to radiation, such as deep uv or 248 nm KrF excimer laser.

2. Description of the Prior Art

As the high integration of semiconductor device is accelerated, the stepper light source becomes shorter in wavelength. For example, deep uv, excimer laser or X rays, which have shorter wavelengths than g line (436 nm) or i line (365 nm), are being applied, or intensively examined as the light source. It is therefore necessary to develop photoresists suitable for these new light sources.

U.S. Pat. Nos. 3,666,473 and 4,173,470 disclose positive photoresist compositions consisting of novolak type resin and naphthoquinone diazide-substituted compound, which are used for g line or i line. When such photoresists are applied for the formation of lithographic patterns using deep uv or excimer laser, novolak and naphthoquinone diazide compounds have so high absorbance in the deep uv region that sensitivity is lowered. It is therefore likely to form poor patterns.

These problems may be solved by using a chemical amplified photoresist composition. The chemical amplified photoresist is a pattern forming material for irradiating radiation, such as deep UV, thereon and causing difference in solubility to developing solution of the exposed and unexposed regions by the generated acid to form patterns on substrates.

Chemical amplified photoresist compositions consist, in general, of two or three components. Two-component system comprises a polymeric resin which can react with acid to decompose, and a compound which generates acid on exposing to light (hereinafter referred to as "photo acid generating agent"). For example, Electrochem. Soc., 1986, 133, 181 discloses a resist comprising poly(tert-butoxycarbonyloxystyrene) and an onium salt of a photo acid generating agent. Three-component chemical amplified photoresist composition comprises a resin which can be dissolved in aqueous alkali solutions (hereinafter referred to as "alkali soluble resin"), a dissolution inhibitor, and a photo acid generating agent. Proc. SPIE, 920, 42(1988) discloses a photoresist consisting of a novolak resin as an alkali soluble resin, a naphthalene grafted with tert-butoxycarbonyl as a dissolution inhibitor, and an onium salt as a photo acid generating agent. Also, a three-component resist is disclosed in J. Photopolym. Sci. Technol., 5, 1, 1992, 67–78, which employs a novolak compound as alkali soluble resin, an onium salt as a photo acid generating agent, and a tert-butoxycarbonyl phosphagen compound as a dissolution inhibitor.

In such two-component chemical amplified photoresist, however, a polymeric resin containing high content of acid-decomposable radical leads to the contraction of resist film during the baking process after irradiating radiation. Furthermore, three-component chemical amplified photoresists have so insufficient dissolution inhibiting effect on the alkali soluble resin that the loss of film is large upon developing the film. In contrast, introducing high content of acid-decomposable radicals into the backbone of the dissolution inhibitor, solubility to resist solvent is reduced.

SUMMARY OF THE INVENTION

It is therefore an object of the present invention to overcome the above problems encountered in the prior arts and to provide a three-component chemical amplified photoresist composition consisting of an alkali soluble resin, a photo acid generating agent and a dissolution inhibitor, which is suitable to form good profile on exposing to light with short wavelength.

It is another object of the present invention to provide a three-component chemical amplified photoresist composition which is superior in heat resistance.

Based on the intensive research of the present inventors, the above objects of the present invention could be accomplished by a provision of a three-component chemical amplified photoresist compound comprising: an alkali soluble resin; a dissolution inhibitor consisting of aromatic polyhydroxy substituted by at least two acid-decomposable radicals; and an a photo acid generating agent of onium salt.

DETAILED DESCRIPTION OF THE INVENTION

In accordance with the present invention, the dissolution inhibitor is characterized in that it has such heat resistance as not to decompose upon baking. Another characteristic of the dissolution inhibitor is that it has a fundamental structure which dissolves well in a resist solution. Further, the inhibitor is large in molecular weight, thereby enhancing the effect of dissolution inhibition in unexposed regions.

The dissolution inhibitor of the present invention has a melting point of higher than 170° C., contributing to the heat resistance of the resist. It is very compatible with alkali soluble resin in addition to being superior in solubility to resist solvent. Also, the dissolution inhibitor is prepared by introducing many alkyl chains without absorbing light in deep UV region into the backbone of inhibitor. Thus, the molecular weight of the dissolution inhibitor is increased. As a result, the resist composition having the inhibiting effect of dissolution in the unexposed region increased as well as having the sensitivity developed is obtainable.

In more detail, the dissolution inhibitor of the present invention is prepared by substituting acid-decomposable radicals represented by the formulars II-1, II-2, II-3 or II-4 to hydrogen in hydroxy group of an aromatic polyhydroxy compound of the following general formula I:

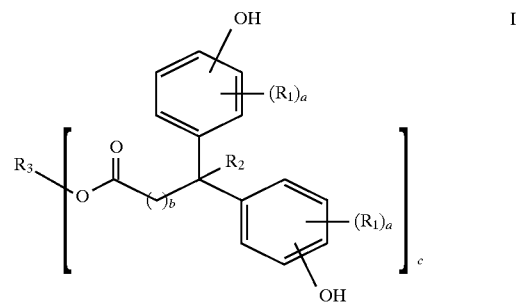

wherein $R_1$ and $R_2$ are independently hydrogen, halogen, an alkyl radical or an alkoxy radical; a is an integer of 1 to 3; b is an integer of 1 to 8; c is an integer of 1 to 12; $R_3$ is an alkoxy radical or an alkoxy radical substituted with ether group, mercapto group, sulfoxide group, sulfone group, aryl group or hydroxy group:

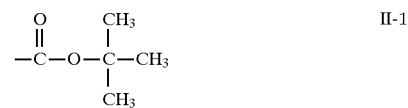

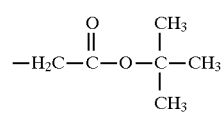

II-2

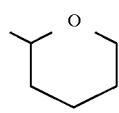

II-3

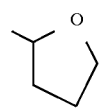

II-4

In accordance with the present invention, at least two radicals selected from the group consisting of the formulas II-1, II-2, II-3 and II-4, being the same with or different from each other, are introduced into the general formula I.

In the formula I, as the alkyl radical of $R_1$ and $R_2$ is preferred a linear chain or a branched chain containing 1 to 4 carbon atoms, more preferably methyl, ethyl, isopropyl and t-butyl. For alkoxy radical of $R_1$ and $R_2$, linear or branched chain containing 1 to 4 carbon atoms is preferred, more preferably being methyl alkoxy, ethyl alkoxy, isopropyl alkoxy, and t-butyl alkoxy.

Preferred examples of the aromatic polyhydroxy compound represented by the general formula I include:

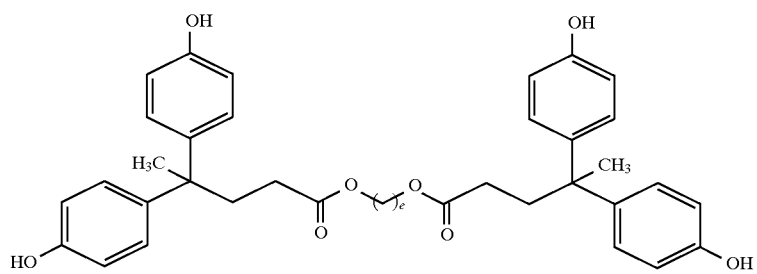

I-1

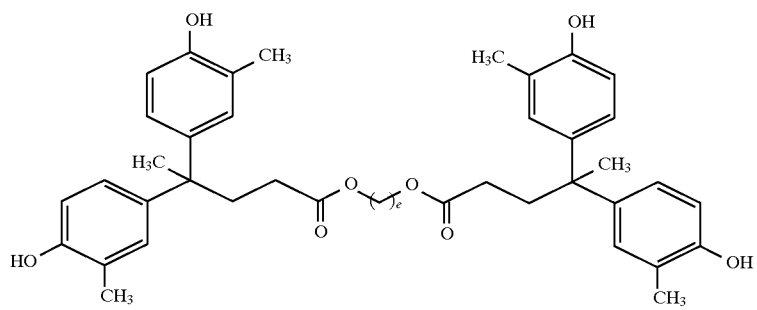

I-2

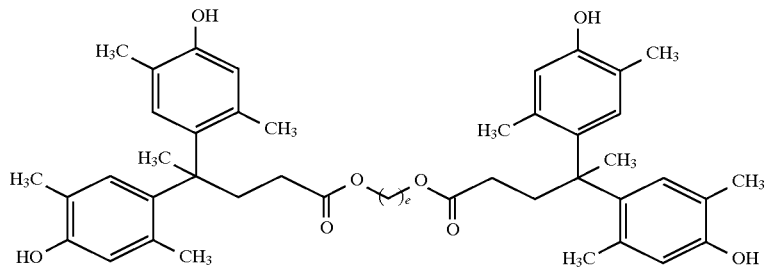

I-3

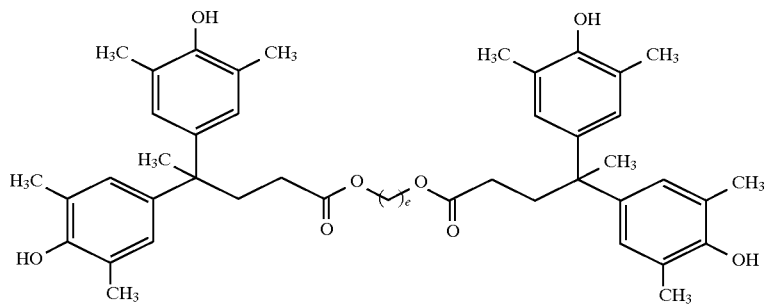

I-4

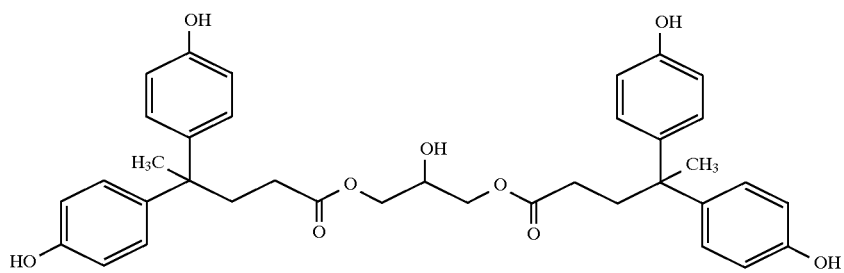
I-5
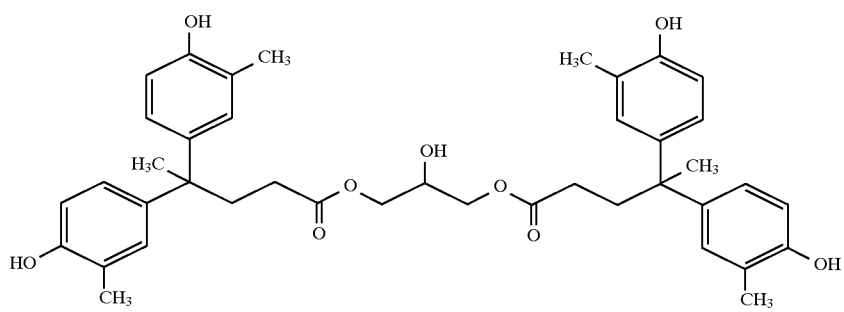
I-6
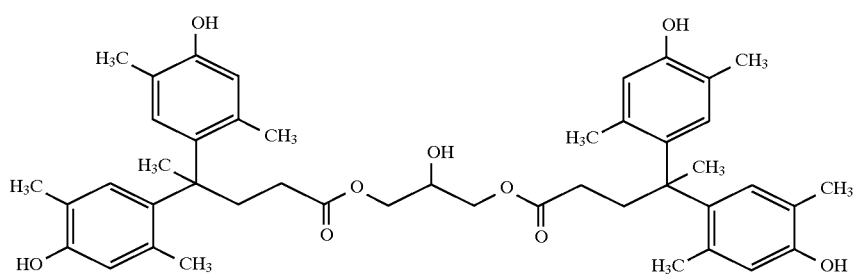
I-7
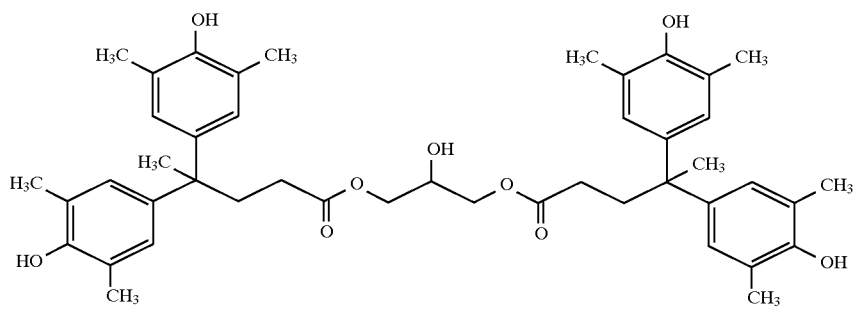
I-8
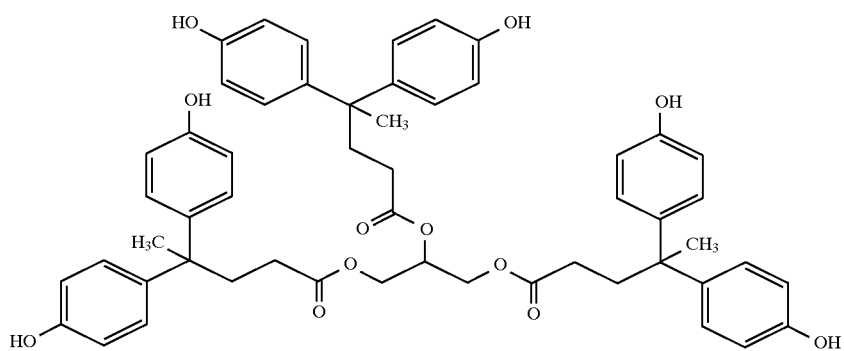
I-9

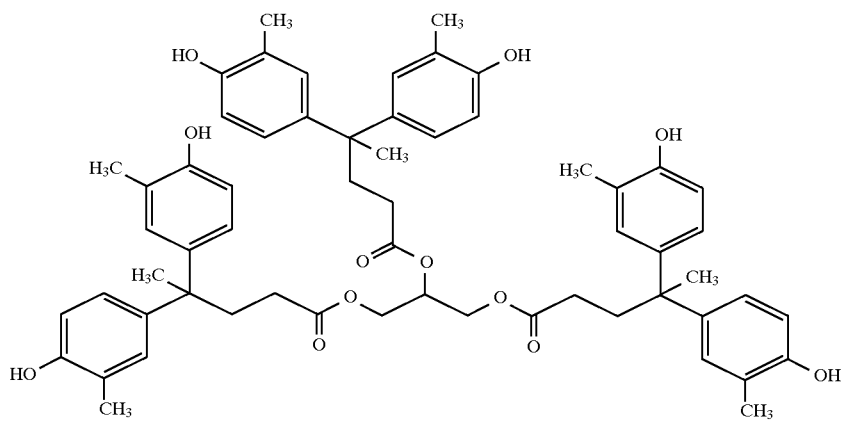
I-10
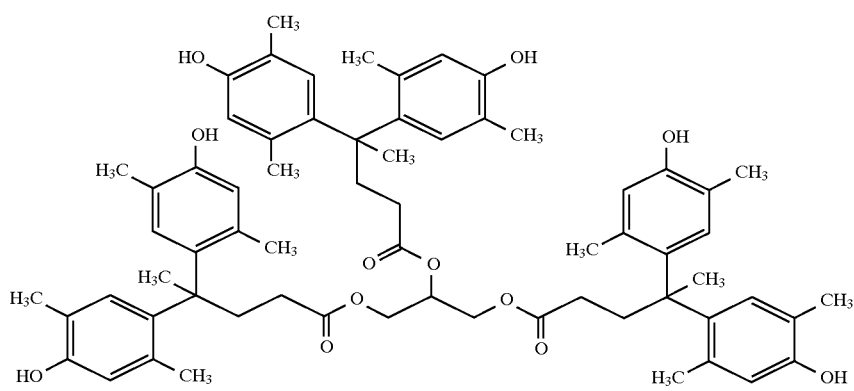
I-11
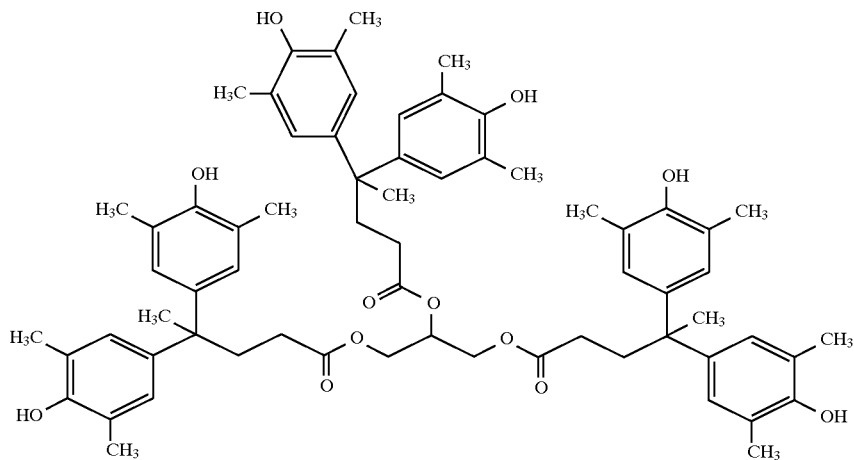
I-12

I-13
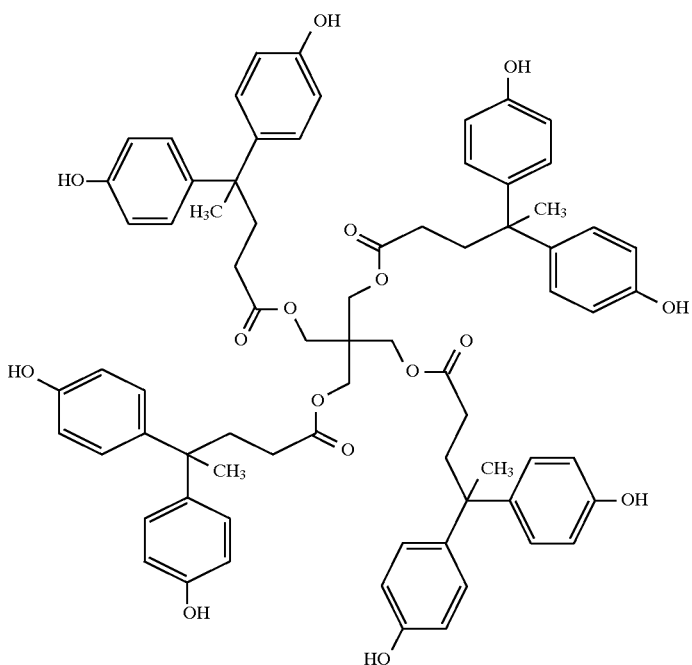
I-14
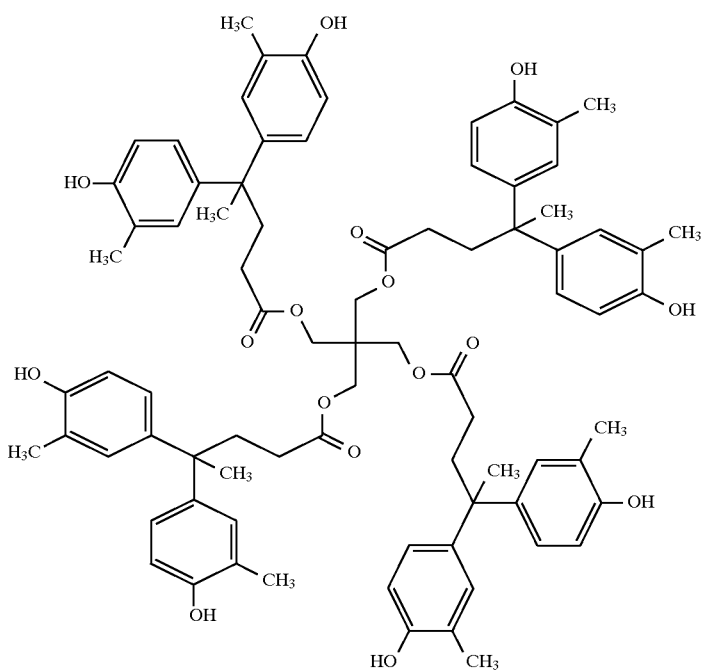

-continued
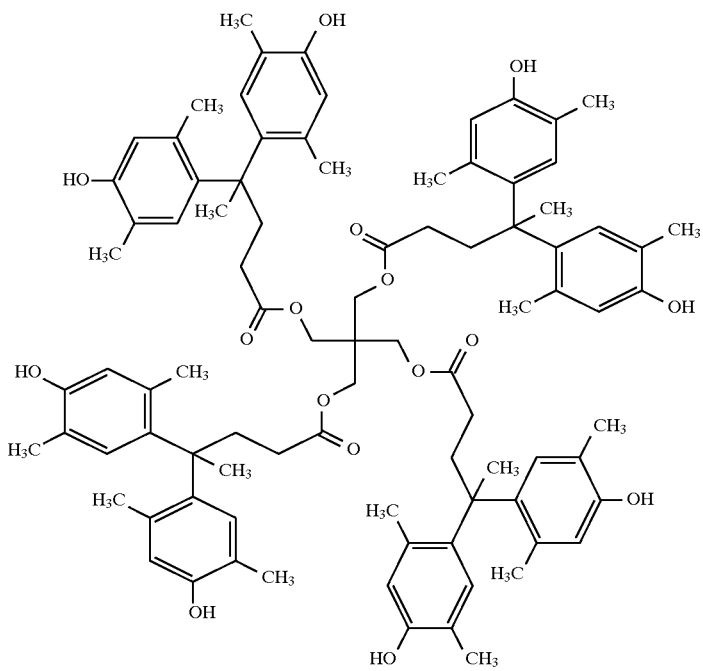
I-15
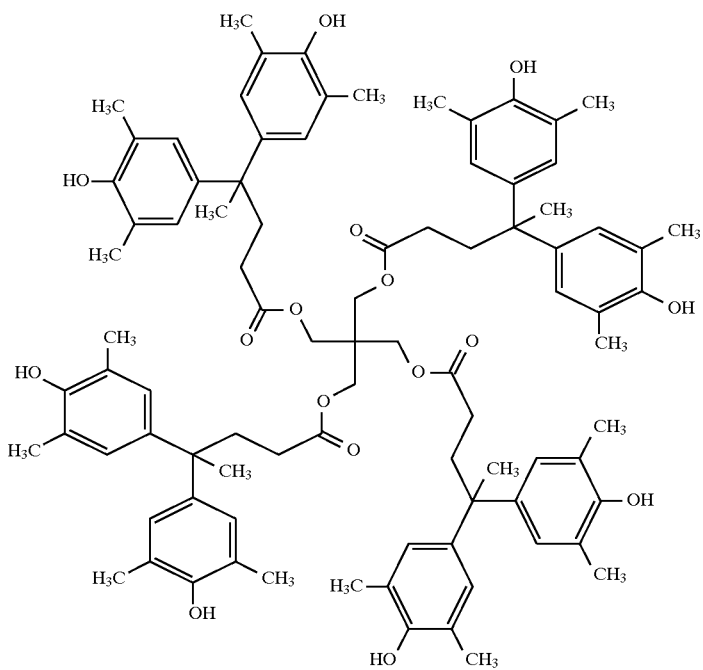
I-16

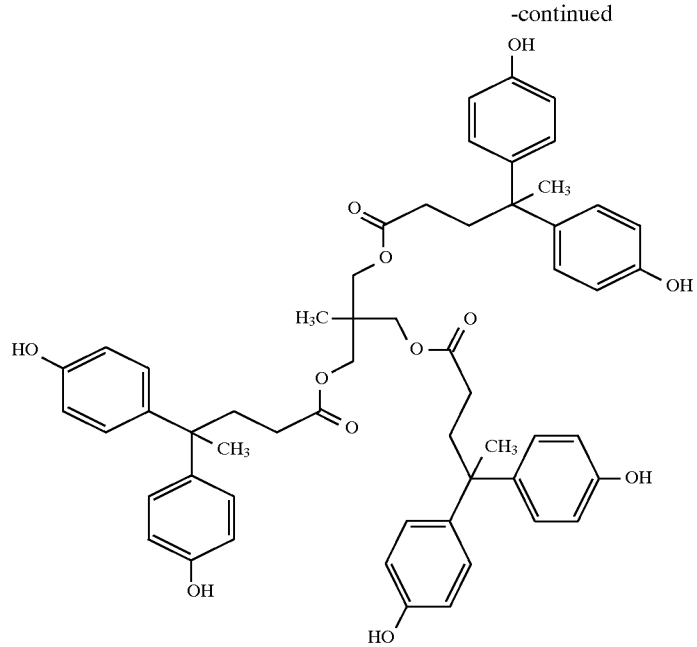
I-17
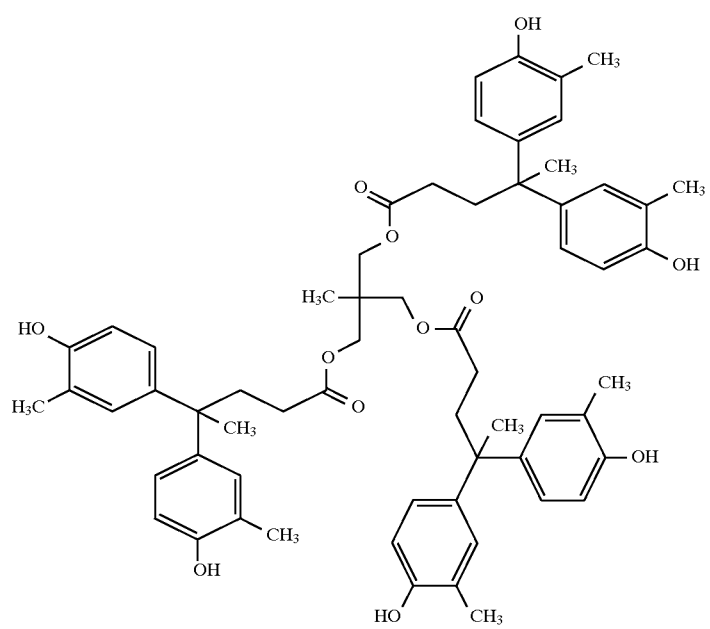
I-18

-continued
I-19
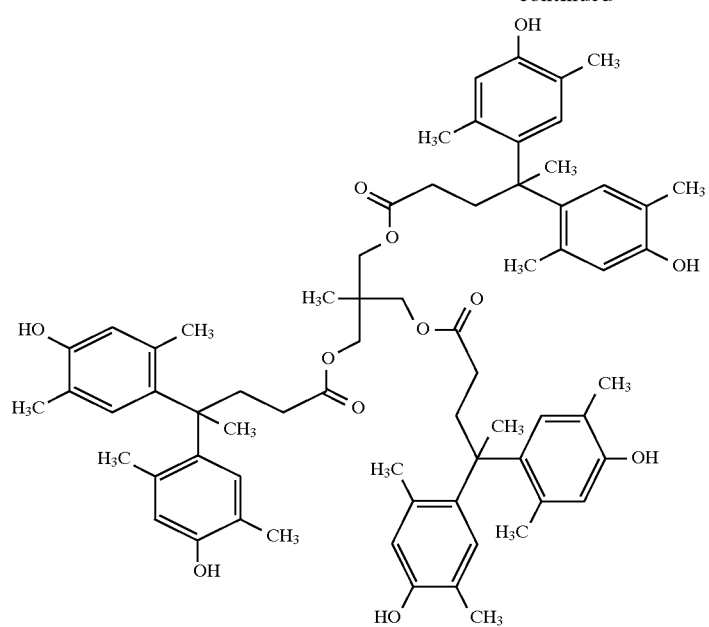
I-20
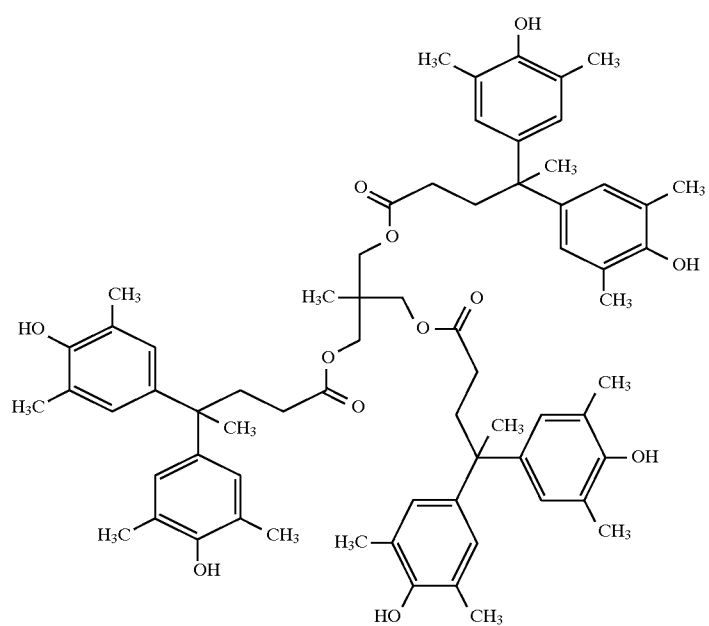

I-21
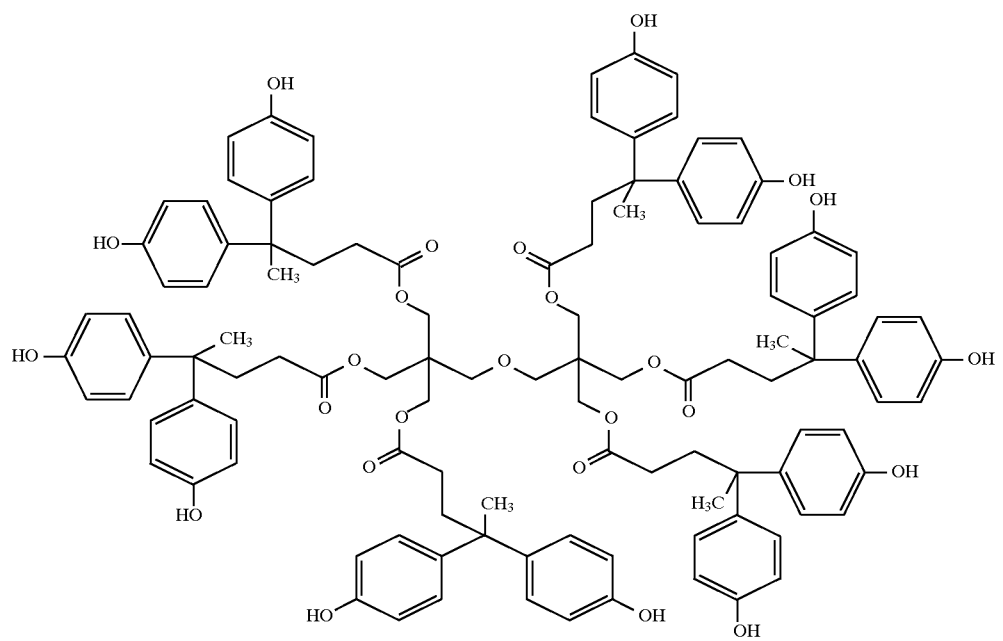
I-22
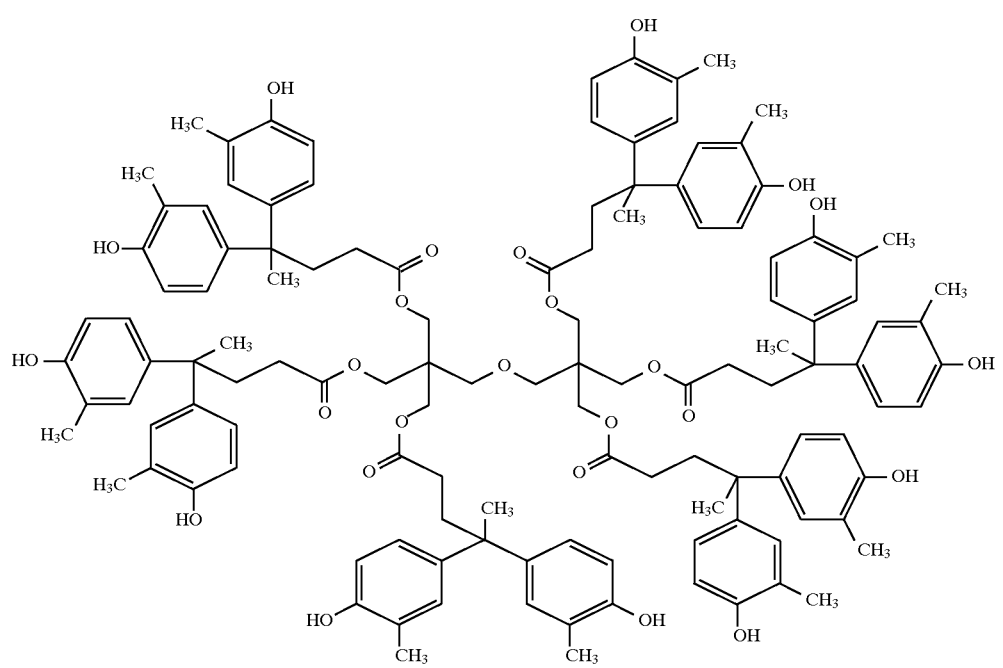

I-23
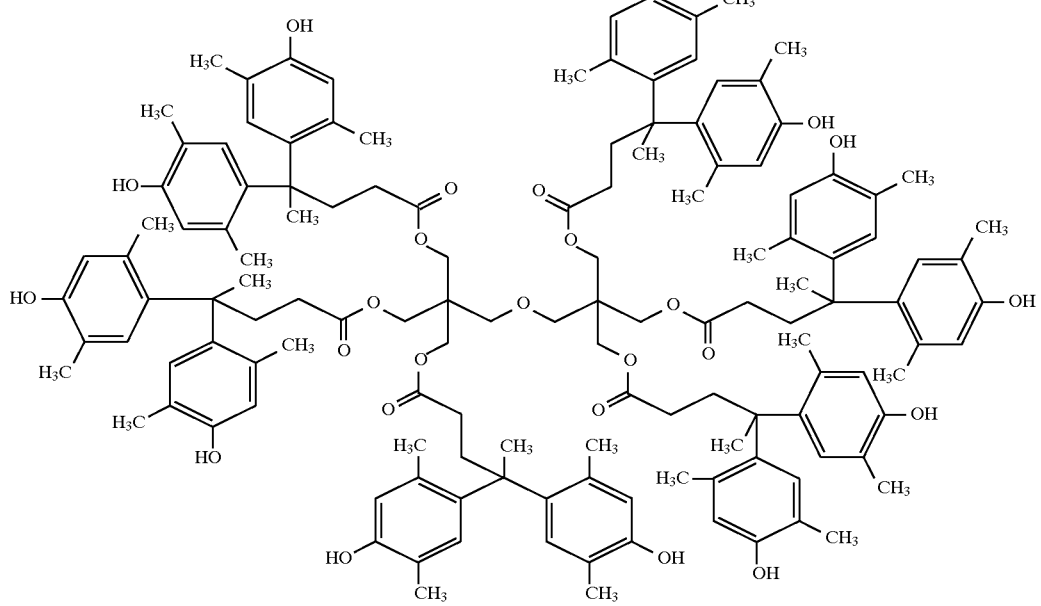
I-24
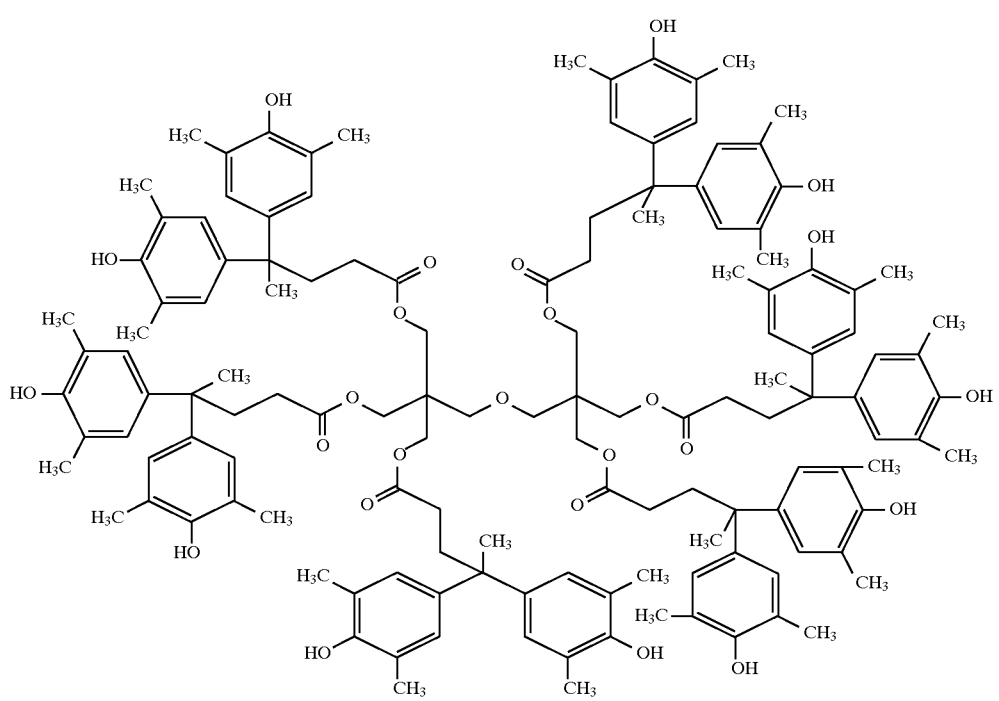
I-25
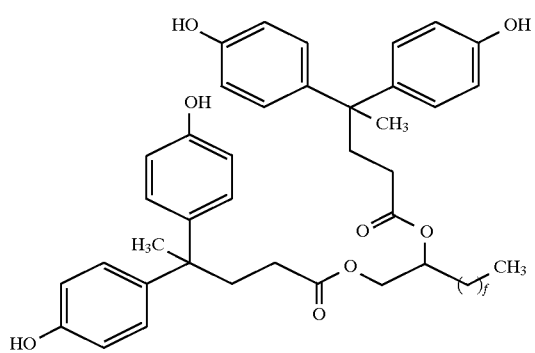

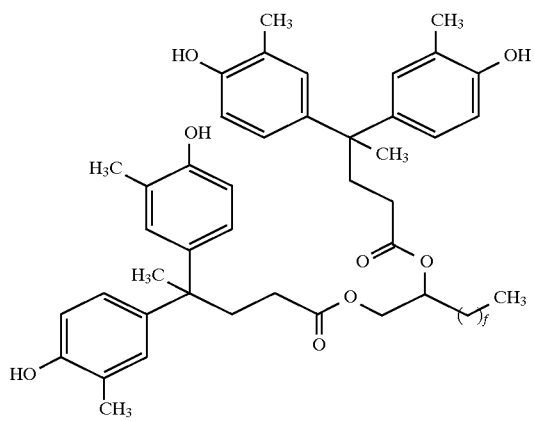
I-26
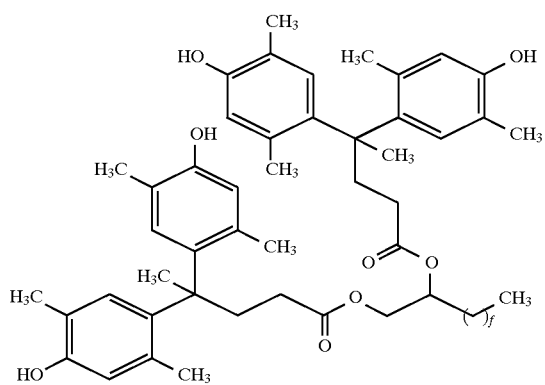
I-27
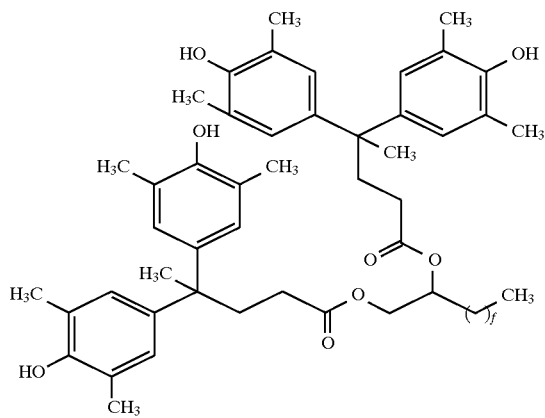
I-28
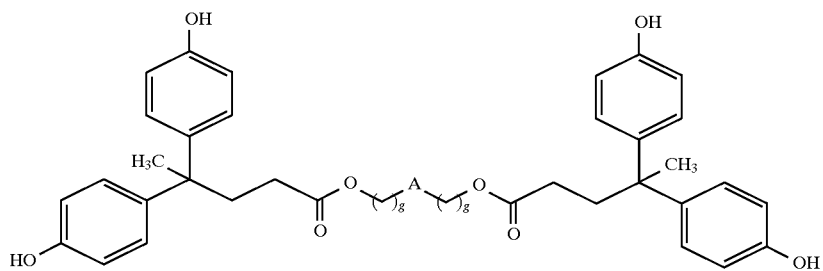
I-29

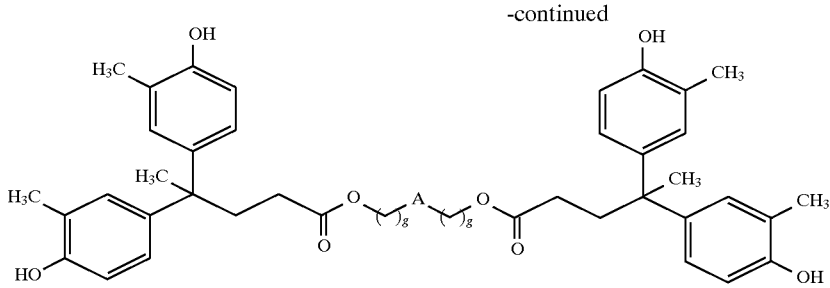

I-30

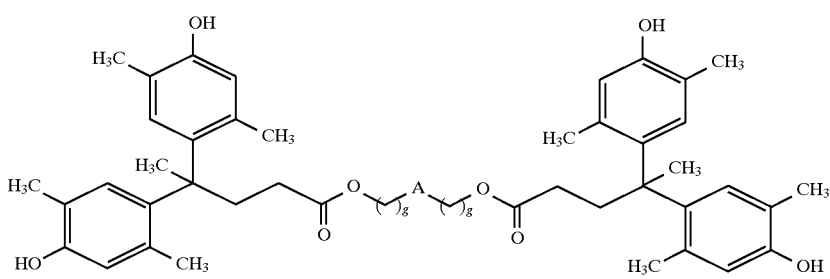

I-31

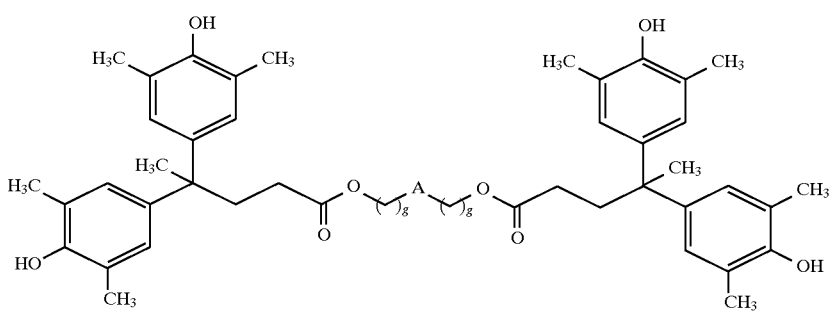

I-32 wherein e is an integer of 1 to 12, f is an integer of 0 to 12, g is an integer of 1 to 12 and A is O, S, $SO_2$ or SO.

It is preferred that the alkali soluble resin used in the present invention has a high glass transition temperature (Tg) or has low light absorbance in wavelengths of radiation. Examples of such alkali soluble resins include carboxyl group-containing methacrylic resin and the derivatives thereof, novolak resins and polyvinylphenol resins. Among these, since polyvinylphenol resins have less absorbance in 248 nm over other resins such as novolak resin, etc., polyvinylphenol resins are usefully used. However, polyvinylphenol resins dissolve too fast in alkali solutions. In the present invention, the dissolution rate of polyvinylphenol resin can be adjusted by combining with the dissolution inhibitor.

The photo acid-generating agent used in the present invention is a compound which is decomposed by irradiating radiations to generate acid, and mainly comprises onium salt, represented by $Ar_3X^+Y^-$ wherein Ar is any one selected from the group consisting of aromatic hydrocarbons and halogen-substituted aromatic hydrocarbons, X is halogen, sulfur or selenium, and Y is $BF_4$, $PF_6$, $AsF_6$, $SbF_6$ or $CF_3SO_3$. These salts are exemplified in J. Am. Chem. Soc., 112, No. 16, 1990, 6004, U.S. Pat. No. 4,933,377 and Germany Patent No. 29,046,260. The added amount of photo acid-generating agent is approximately 0.01 to 30 parts by weight based on 100 parts by weight of alkali soluble resin and preferably approximately 0.5 to 5 parts by weight.

Solvents dissolving each component, used in the present invention, include cyclohexanone, ethylenedichloride, methylethylketone, γ-butyrolactone, ethyleneglycol monomethylether, ethyleneglycol monoethylether, ethyleneglycol monoethylether acetate, toluene, methyl methoxypropionate, ethyl methoxypropionate, N,N-dimethylformamide, dimethylsulfoxide, etc., these may be used alone, or mixed with at least two, if necessary.

Alkaline developing solution used in the present invention includes inorganic alkali, such as sodium hydroxide and sodium carbonate; amines, such as ethylamine, diethylamine and triethylamine; quaternary ammonium salts, such as tetramethyl ammonium hydroxide and tetraethyl ammonium hydroxide. Surfactant may be added to said alkaline developing solution in an appropriate amount.

The resist composition of the present invention may be patterned by well-known processes, which comprise coating on a silicon wafer, pre-heating, irradiating, post-heating, and developing.

A better understanding of the present invention may be obtained in light of following examples which are set forth to illustrate, but are not to be construed to limit, the present invention.

SYNTHESIS OF AROMATIC POLYHYDROXY COMPOUND

SYNTHESIS EXAMPLE I 50.0 g of 4,4-bis(4-hydroxyphenyl)valeric acid, 7.7 g of 1,4-butanediol, 0.9 g of dibutyltin oxide and 50 ml of tetralin were placed in a reactor and heated slowly to 190° C. with stirring. Then, pressure in the reactor was reduced to 70 mmHg. After reaction for 6 hrs, water produced as a by product was removed. In order to remove the remaining tetralin in the reactor after the reaction for 6 hrs, the reactor was reduced to 20 mmHg of pressure to completely remove the solvent over 3 hrs. After completing the reaction, the inside temperature of the reactor was lowered to 80° C., 0.5 g of oxalic acid and 150 ml of ethanol was added therein and completely dissolved to be filtered off. The filtrate was cooled, crystallized and dried, to obtain 44 g of aromatic polyhydroxy compound of the following structural formula A as white powder.

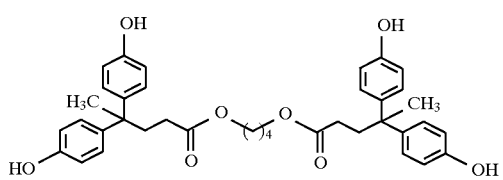

SYNTHESIS EXAMPLE II

The procedure of Synthesis Example I was repeated using 10.0 g of 1,6-hexanediol instead of 7.7 g of 1,4-butanediol, to obtain 45 g of aromatic polyhydroxy compound of the following structural formula B.

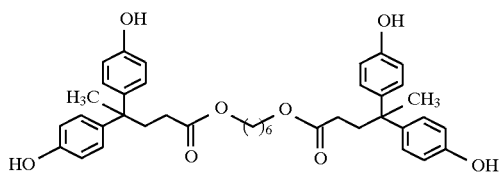

SYNTHESIS EXAMPLE III

The procedure of Synthesis Example I was repeated using 12.4 g of 1,8-oxanediol instead of 7.7 g of 1,4-butanediol, to obtain 52 g of aromatic polyhydroxy compound of the following structural formula C.

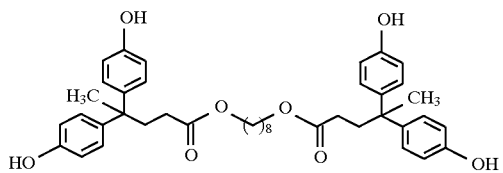

SYNTHESIS OF DISSOLUTION INHIBITOR

SYNTHESIS EXAMPLE IV

In a reactor, 3.0 g of the compound of the structural formula A, 0.1 g of 18-crown-6, and 3.5 g of potassium carbonate were placed, followed by adding 50 ml of tetrahydrofuran. After cooling the periphery of the reaction, 5.4 g of di-tert-butyldicarbonate was poured. The resulting reactants were reacted for 3 hours and then filtered off. The filtrate was precipitated in methanol, and then recrystallized several times, to obtain 3.7 g of white compound. It could be determined by analyses of liquid chromatography and NMR that the synthesis was perfectly effected. This compound was used as the dissolution inhibitor for resist composition.

SYNTHESIS EXAMPLE V 4.6 g of a dissolution inhibitor was obtained in a similar manner to that of Synthesis Example 4, except that, instead of the compound of the structural formula A, 5.8 g of the compound of the structural formula B was used.

SYNTHESIS EXAMPLE VI 5.2 g of a dissolution inhibitor was obtained in a similar manner to that of Synthesis Example 4, except that, instead of the compound of the structural formula A, 6.5 g of the compound of the structural formula C was used.

EXAMPLE I 100 parts by weight of polyvinylphenol with a average molecular weight calculated in terms of standard polystyrene of 9,000 and a molecular weight distribution of 1.6, 30 parts by weight of the dissolution inhibitor obtained in Synthesis Example IV and 3 parts by weight of triphenylsulfoniumtriflate, a photo acid generating agent, were dissolved in cyclohexanone. The cyclohexanone was used in 3.3-times of weight of the solid content (polyvinylphenol, dissolution inhibitor and photo acid generating agent). This dissolved resist was filtered with 0.1 $\mu$m membrane filter. The filtrate was coated on a silicon wafer in a thickness of 0.8 $\mu$m, which was then heat treated on a hot plate at 90° C. for 90 sec. After being exposed to light by use of 248 nm KrF excimer laser steper, the coated silicon wafer was heat treated on a hot plate at 80° C. for 30 sec. It was developed for 30 sec in a developing solution, to obtain positive patterns of line/space 0.28 $\mu$m wide. The developing solution used herein was an aqueous solution in which the AZ solution from Hoechst, Germany, was mixed with deionized water at a 1:1 ratio. Polyvinylphenol and triphenylsulfoniumtriflate were obtained in well-known processes.

EXAMPLE II

The procedure of Example I was repeated using 30 parts by weight of the dissolution inhibitor obtained in Synthesis Example V instead of 30 parts by weight of the dissolution inhibitor obtained in Synthesis Example IV, to give positive patterns of line/space 0.30 $\mu$m wide.

EXAMPLE III

The procedure of Example I was repeated using 30 parts by weight of the dissolution inhibitor obtained in Synthesis Example V instead of 30 parts by weight of the dissolution inhibitor obtained in Synthesis Example IV, to give positive patterns of line/space 0.30 $\mu$m wide.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A chemically amplified photoresist composition comprising:

an alkali soluble resin;

a dissolution inhibitor which is an aromatic polyhydroxy compound of the following general formula I:

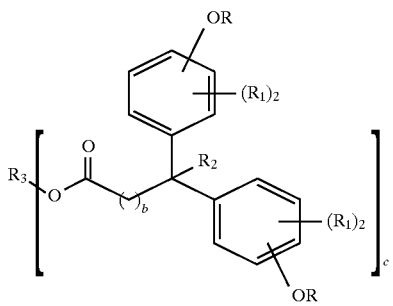

wherein $R_1$ and $R_2$ are independently selected from the group consisting of hydrogen, halogen, an alkyl radical and an alkoxy radical; a is an integer of 1 to 3; b is an integer of 1 to 8; c is an integer of 1 to 12; $R_3$ is an alkoxy radical or an alkoxy radical substituted with an ether group, a mercapto group, a sulfoxide group, a sulfone group, an aryl group or a hydroxyl group;

R is independent and is at least two of the radicals represented by formulas II-1, II-2, II-3, or II-4:

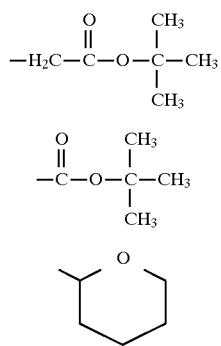

and a photo acid generating agent of an onium salt represented by the following general formula III:

$$Ar_3X^+Y^- \qquad (III)$$

wherein Ar is any one selected from the group consisting of aromatic hydrocarbons and halogen-substituted aromatic hydrocarbons, x is selected from the group consisting of halogen, sulfur, and selenium, and Y is selected from the group consisting of $BF_4$, $PF_6$, $AsF_6$, $SbF_6$ and $CF_3SO_3$.

2. The three-component chemically amplified photoresist composition in accordance with claim 1, wherein said dissolution inhibitor and said photo acid generating agent are present in an amount of 10 to 40 parts by weight and 0.5 to 30 parts by weight, respectively, based on 100 parts by weight of said alkali soluble resin.

3. The three-component chemical amplified photoresist composition in accordance with claim 1, wherein said alkali soluble resin is a polyvinylphenol with a average molecular weight calculated in terms of standard polystyrene of 2,000 to 20,000.

* * * * *